United States Patent (10) Patent No.: US 7,892,936 B1
Wu et al. (45) Date of Patent: Feb. 22, 2011

(54) SELF ALIGNED INTEGRATION OF HIGH DENSITY PHASE CHANGE MEMORY WITH THIN FILM ACCESS DEVICE

(75) Inventors: Albert Wu, Palo Alto, CA (US); Runzi Chang, San Jose, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 12/435,713

(22) Filed: May 5, 2009

Related U.S. Application Data

(60) Provisional application No. 61/052,506, filed on May 12, 2008.

(51) Int. Cl.
*H01L 21/8239* (2006.01)
*H01L 45/00* (2006.01)

(52) U.S. Cl. .............................. 438/385; 257/E21.645; 257/E45.002

(58) Field of Classification Search ................... 438/385
See application file for complete search history.

(56) References Cited

U.S. PATENT DOCUMENTS

| 7,259,023 | B2 * | 8/2007 | Kuo et al. ...................... 438/3 |
| 2007/0029676 | A1 * | 2/2007 | Takaura et al. .............. 257/758 |
| 2007/0171700 | A1 * | 7/2007 | Burnett et al. .............. 365/154 |

* cited by examiner

*Primary Examiner*—Stephen W Smoot

(57) ABSTRACT

Embodiments of the present invention provide a method that includes depositing a first electrode film on one or more wordline structures, depositing a phase change material (PCM) film on the first electrode film, depositing a second electrode film on the PCM film, depositing a third electrode film on the second electrode film, depositing an access device film on the third electrode film, and depositing a fourth electrode film on the access device film to form a stack of films, wherein the stack of films comprises the first electrode film, the PCM film, the second electrode film, the third electrode film, the access device film, and the fourth electrode film. Other embodiments may be described and/or claimed.

12 Claims, 4 Drawing Sheets

SELF ALIGNED INTEGRATION OF HIGH DENSITY PHASE CHANGE MEMORY WITH THIN FILM ACCESS DEVICE

CROSS REFERENCE TO RELATED APPLICATIONS

The present application claims priority to U.S. Patent Application No. 61/052,506, filed May 12, 2008, entitled "Self Aligned Integration of High Density Phase Change Memory with Thin Film Access Device," the entire specification of which is hereby incorporated by reference in its entirety for all purposes, except for those sections, if any, that are inconsistent with this specification.

TECHNICAL FIELD

Embodiments of the present invention relate to the field of electronic memory devices, and more particularly, to phase change material (PCM) memory devices and methods of fabrication.

BACKGROUND

Memory cells of electronic memory devices such as dynamic random access memory (DRAM) typically employ a number of electronic components in order to store data. For example, in order to store data, a combination of electronic components such as transistors, diodes, and/or capacitors are typically employed in such memory cells to store or not store electrical charges. A charge stored in such a memory cell, may indicate a logic "1", and no charge stored in such a memory cell, may indicate a logic "0".

An alternative approach for storing data is to use memory cells made of phase change material (PCM). Phase change material may include a material that can be placed into at least two physical states—e.g., a crystalline state and an amorphous state—by increasing or decreasing a temperature of the phase change material. By changing the physical state of the phase change material, certain characteristics of the material, such as electrical resistance, may also change. Such properties may be exploited to form memory cells made of phase change material (referred to herein as "PCM memory cells").

As devices including PCM memory cells (referred to herein as "PCM memory devices") scale to smaller sizes, fabrication may be limited by higher aspect ratios of device structures and/or limits of conventional lithography and physical vapor deposition (PVD) processes. Techniques and structures that overcome such challenges may allow continued scaling of PCM memory devices to smaller sizes, or may allow increased memory density of PCM memory devices, or combinations thereof.

SUMMARY

The present invention provides a method that includes depositing a first electrode film on one or more wordline structures, depositing a phase change material (PCM) film on the first electrode film, depositing a second electrode film on the PCM film, depositing a third electrode film on the second electrode film, depositing an access device film on the third electrode film, and depositing a fourth electrode film on the access device film to form a stack of films, wherein the stack of films comprises the first electrode film, the PCM film, the second electrode film, the third electrode film, the access device film, and the fourth electrode film.

The present invention further provides an apparatus that includes a semiconductor substrate, one or more wordline structures coupled with the semiconductor substrate, one or more phase change material (PCM) memory cells coupled with the one or more wordline structures, and one or more access devices coupled with the one or more PCM memory cells wherein the one or more PCM memory cells and the one or more access devices are formed by a self-alignment process using a single common mask for patterning the one or more PCM memory cells and the one or more access devices.

BRIEF DESCRIPTION OF THE DRAWINGS

Embodiments of the present invention will be readily understood by the following detailed description in conjunction with the accompanying drawings. To facilitate this description, like reference numerals designate like structural elements. Embodiments of the invention are illustrated by way of example and not by way of limitation in the figures of the accompanying drawings.

FIGS. 1A-9A include plan views and FIGS. 1B-9B include elevation cross-section views.

DETAILED DESCRIPTION OF EMBODIMENTS OF THE INVENTION

Embodiments of the present invention may describe structures and techniques associated with self-aligned integration of high density phase change memory with thin film access device. In the following detailed description, reference is made to the accompanying drawings which form a part hereof wherein like numerals designate like parts throughout, and in which is shown by way of illustration embodiments in which the invention may be practiced. It is to be understood that other embodiments may be utilized and structural or logical changes may be made without departing from the scope of the present invention. Therefore, the following detailed description is not to be taken in a limiting sense, and the scope of embodiments in accordance with the present invention is defined by the appended claims and their equivalents.

The description may use perspective-based descriptions such as up/down, back/front, and top/bottom. Such descriptions are merely used to facilitate the discussion and are not intended to restrict the application of embodiments of the present invention.

For the purposes of the present invention, the phrase "A/B" means A or B. For the purposes of the present invention, the phrase "A and/or B" means "(A), (B), or (A and B)." For the purposes of the present invention, the phrase "at least one of A, B, and C" means "(A), (B), (C), (A and B), (A and C), (B and C), or (A, B and C)."

The description may use the phrases "in an embodiment," or "in embodiments," which may each refer to one or more of the same or different embodiments. Furthermore, the terms "comprising," "including," "having," and the like, as used with respect to embodiments of the present invention, are synonymous.

Figure 1A:
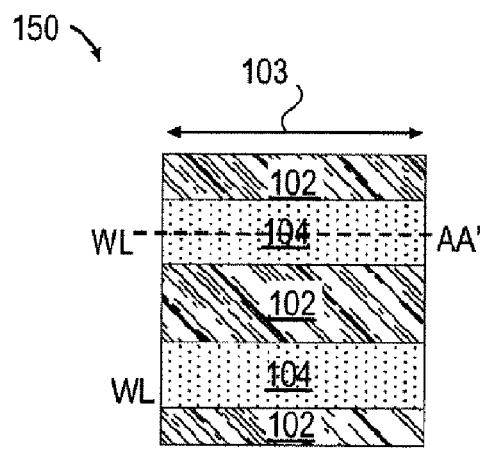
FIGS. 1A-1B, 2A-2B, 3A-3B, 4A-4B, 5A-5B, 6A-6B, 7A-7B, 8A-8B, and 9A-9B schematically illustrate a PCM memory device during various stages of fabrication, in accordance with various embodiments of the present invention.
Figure 1B:

FIG. 1A is a plan view and FIG. 1B is an elevation view cross-section schematic of a PCM memory device 150 during fabrication. FIGS. 1A-1B may depict PCM memory device 150 after forming one or more wordline structures 104 on semiconductor substrate 102. FIG. 1B depicts a cross-section of FIG. 1A along line AA' as indicated.

In an embodiment, PCM memory device 150 in fabrication comprises a semiconductor substrate 102 and one or more wordline structures 104, coupled as shown. One or more wordline structures 104 may be formed on semiconductor substrate 102. Semiconductor substrate 102 may be prepared for wordline 104 formation by using cleaning or polishing operations, or combinations thereof. Periphery circuitry such as, for example, amplifiers, or signal processors, or other devices may be formed on semiconductor substrate 102 prior to formation of the wordline structures 104. In an embodiment, one or more wordline structures 104 are formed by depositing a wordline material on a semiconductor substrate 102, patterning the deposited wordline material to define the one or more wordline structures 104, and etching to form the one or more wordline structures 104. In one embodiment, one or more wordline structures 104 are formed by a damascene process.

The one or more wordline structures 104 may have a longitudinal direction as indicated by the arrow 103. The orientation of structures or techniques of fabrication associated with the PCM memory device 150 are further described below with respect to the longitudinal direction 103 of the one or more wordline structures 104.

Semiconductor substrate 102 may include a variety of semiconductor materials including, for example, silicon (Si) or germanium (Ge), or combinations thereof. Other semiconductor materials may be used in other embodiments. The one or more wordline structures 104 may include a variety of materials including metals such as, for example, aluminum (Al), copper (Cu), tungsten (W), or combinations thereof. Subject matter is not limited in this regard and, accordingly, other materials may be used in the composition of a wordline.

Figure 2A:
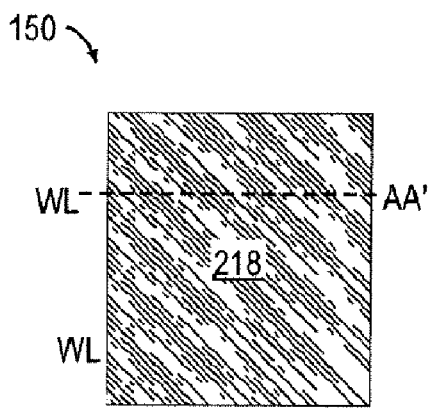
Figure 2B:
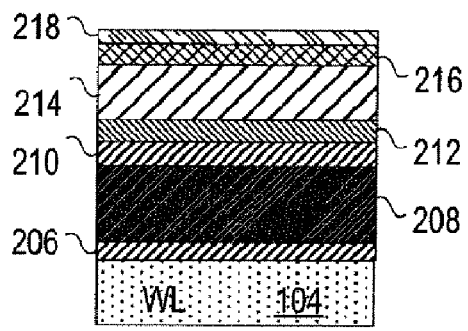

FIG. 2A is a plan view and FIG. 2B is another elevation view cross-section schematic of a PCM memory device 150 during fabrication. In particular, FIGS. 2A-2B depict PCM memory device 150 after deposition of a stack of films on the one or more wordline structures 104. FIG. 2B depicts a cross-section of FIG. 2A along line AA' as indicated.

In an embodiment, at the stage of fabrication shown in FIGS. 2A-2B, PCM memory device 150 comprises one or more wordline structures 104, first electrode film 206, phase change material (PCM) film 208, second electrode film 210, third electrode film 212, access device film 214, fourth electrode film 216, and hard mask film 218, coupled as shown. First electrode film 206, PCM film 208, and second electrode film 210 may be used to form one or more PCM memory cells on the one or more wordline structures 104. Third electrode film 212, access device film 214 and fourth electrode film 216 may be used to form an access device on the one or more PCM memory cells. Deposition of the first electrode film 206, the PCM film 208, the second electrode film 210, the third electrode film 212, the access device film 214, the fourth electrode film 216, and the hard mask film 218 may be accomplished by any suitable deposition process. In an embodiment, deposition of such films is accomplished by physical vapor deposition (PVD), chemical vapor deposition (CVD), atomic layer deposition (ALD), or combinations thereof. Subject matter is not limited in this regard and may include other deposition techniques in other embodiments.

First electrode film 206 may be deposited on one or more wordline structures 104. First electrode film 206 may provide a diffusion barrier for the PCM film 208. In accordance with various embodiments, first electrode film 206 may comprise a metal and may comprise a thickness less than approximately 30 nanometers (nm). Subject matter is not limited in this regard and first electrode film 206 may include other materials and/or thicknesses in other embodiments.

PCM film 208 may be deposited on the first electrode film 206. In one embodiment, PCM film 208 includes a material that can be placed into at least two physical states—e.g., a crystalline state and an amorphous state—by increasing or decreasing a temperature of the phase change material. By changing the physical state of the phase change material, certain characteristics of the material, such as electrical resistance, may also change. Such properties may be exploited to form PCM memory cells. In an embodiment, PCM film 208 comprises germanium (Ge), antimony (Sb), or tellurium (Te), or combinations thereof. In another embodiment, PCM film 208 comprises a thickness less than approximately 60 nm. Subject matter is not limited in this regard and PCM film 208 may include other materials and/or thicknesses in other embodiments.

Second electrode film 210 may be deposited on the PCM film 208. Second electrode film 210 may provide a diffusion barrier for the PCM film 208. In accordance with various embodiments, second electrode film 210 may comprise a metal and may comprise a thickness less than approximately 30 nanometers (nm). Subject matter is not limited in this regard and second electrode film 210 may include other materials and/or thicknesses in other embodiments.

Third electrode film 212 may be deposited on the second electrode film 210. Third electrode film 212 may provide a diffusion barrier for the access device film 214. In an embodiment, third electrode film 212 may comprise a metal including, for example, titanium (Ti) in titanium nitride (TiN), or tantalum (Ta) in tantalum nitride (TaN), or combinations thereof and third electrode film 212 may comprise a thickness less than approximately 30 nanometers (nm). Subject matter is not limited in this regard and third electrode film 212 may include other materials and/or thicknesses in other embodiments.

Access device film 214 may be deposited on the third electrode film 212. Access device film 214 may comprise a variety of materials. In an embodiment, access device film 214 may comprise polysilicon, or a material comprising Ge, Sb, or Te, or combinations thereof, and access device film 214 may comprise a thickness less than approximately 60 nm. Subject matter is not limited in this regard and access device film 214 may include other materials and/or thicknesses in other embodiments.

Fourth electrode film 216 may be deposited on the access device film 214. Fourth electrode film 216 may provide a diffusion barrier for the access device film 214. In an embodiment, fourth electrode film 216 may comprise a metal including, for example, titanium (Ti) in titanium nitride (TiN), or tantalum (Ta) in tantalum nitride (TaN), or combinations thereof, and fourth electrode film 216 may comprise a thickness less than approximately 30 nanometers (nm). Subject matter is not limited in this regard and fourth electrode film 216 may include other materials and/or thicknesses in other embodiments.

In an embodiment, no patterning processes are performed on the stack of films until after depositing a fourth electrode 216 film on the access device film 214. In a self-alignment process integration, one or more access devices comprising films 212, 214, 216 and one or more PCM memory cells comprising films 206, 208, 210 may be simultaneously patterned and etched after formation of the stack of films. Patterning processes may include, for example, lithography, or etch processes, or combinations thereof. A self-alignment process may allow for increased PCM memory density, increased process window, or may otherwise overcome challenges associated with higher aspect ratio structures of PCM memory device 150 as the PCM technology is scaled to smaller sizes.

Stack of films 206, 208, 210, 212, 214, and 216 may be patterned to form one or more pillar structures 519 (described further with respect to FIG. 5). In an embodiment, patterning stack of films 206, 208, 210, 212, 214, and 216 is accomplished by using a hard mask film 218. In an embodiment, hard mask film 218 is deposited on the stack of films. In another embodiment, hard mask film 218 is deposited on the fourth electrode film 216 of the stack of films. In yet another embodiment, a sacrificial film (not shown) is deposited on the fourth electrode film 216 and hard mask film 218 is deposited on the sacrificial film. Hard mask film 218 may comprise a variety of materials. In an embodiment, hard mask film 218 comprises a material with high etch selectivity relative to the sacrificial film. In an embodiment, hard mask film 218 comprises silicon nitride (SiN) and sacrificial film comprises polysilicon. Subject matter is not limited in this regard and may include other materials in other embodiments.

Figure 3A:
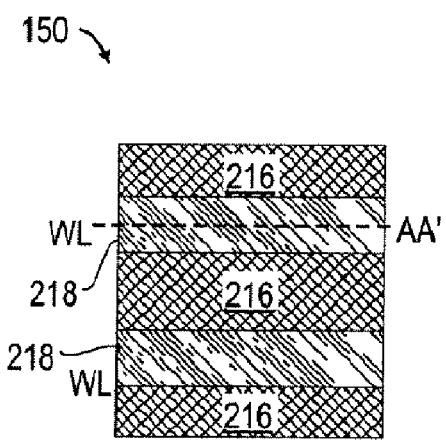
Figure 3B:
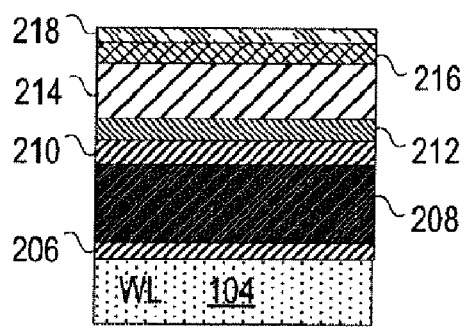

FIG. 3A is another plan view and FIG. 3B is another elevation view cross-section schematic of PCM memory device 150 in fabrication. FIGS. 3A-3B depict PCM memory device 150 after patterning hard mask film 218 using a first one dimensional pattern. FIG. 3B depicts a cross-section of FIG. 3A along line AA' as indicated.

As shown in FIG. 3A, PCM memory device 150 comprises one or more wordline structures 104, first electrode film 206, phase change material (PCM) film 208, second electrode film 210, third electrode film 212, access device film 214, fourth electrode film 216, and hard mask film 218, coupled as shown. The hard mask film 218 is patterned with a first one dimensional pattern to form one or more lines or line structures of hard mask film 218 on the fourth electrode film 216. The exposed fourth electrode film 216 where hard mask film 218 material is removed may be referred to as a space or trench structure.

In an embodiment, hard mask film 218 is patterned using a first one dimensional pattern to form lines of hard mask film 218 and spaces in the hard mask film 218 to expose underlying material (fourth electrode film 216) wherein a longitudinal direction of the lines of the first one dimensional pattern is substantially parallel with or substantially perpendicular with a longitudinal direction 103 of the one or more wordline (WL) structures 104. In an embodiment, the lines of the first one dimensional pattern are substantially parallel with the longitudinal direction 103 of the one or more wordline structures 104. In other embodiments, the lines of hard mask film 218 formed by the first one dimensional pattern are substantially perpendicular with the longitudinal direction 103 of the one or more wordline structures 104.

In an embodiment, patterning the hard mask film 218 using a first one dimensional pattern may include etching the hard mask film 218 to remove material from the spaces of the first one dimensional pattern to expose underlying material 216. A one dimensional pattern may be a pattern comprising lines and spaces.

Figure 4A:
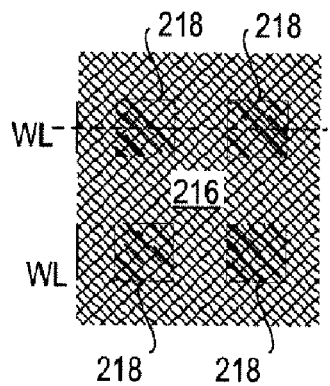
Figure 4B:
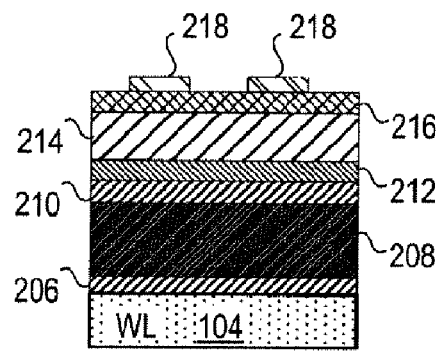

FIG. 4A is another plan view and FIG. 4B is another elevation view cross-section schematic of PCM memory device 150 during fabrication. FIGS. 4A-4B depict PCM memory device 150 after patterning hard mask film 218 using a second one dimensional pattern. FIG. 4B depicts a cross-section of FIG. 4A along line AA' as indicated.

As shown in FIG. 4A, PCM memory device 150 comprises one or more wordline structures 104, first electrode film 206, phase change material (PCM) film 208, second electrode film 210, third electrode film 212, access device film 214, fourth electrode film 216, and hard mask film 218, coupled as shown. The hard mask film 218 may be patterned with a second one dimensional pattern comprising lines and spaces wherein a longitudinal direction of the lines of the second one dimensional pattern is substantially perpendicular with the longitudinal direction of the lines of the first one dimensional pattern.

Patterning with a first and second one dimensional pattern in accordance with embodiments described herein may provide a pattern according to PCM memory device 150 wherein rectangular areas of hard mask film 218 remain coupled with the underlying material 216 which may be, for example, the fourth electrode film 216 in an embodiment. In an embodiment, first and second one dimensional patterning provides an increased process window for PCM memory device 150 fabrication. Variation of a rectangular structure 218 may be more readily controlled than, for example, a circular structure. Patterning with a first and second one dimensional pattern may allow pitch reduction for a given lithography generation. In an embodiment, patterning with a first and second one dimensional pattern replaces conventional contact lithography.

Patterning the hard mask film 218 using a second one dimensional pattern may include etching the hard mask film 218 to remove material from the spaces of the second one dimensional pattern. An etchant may be selected wherein the etchant comprises a slower etch rate for the fourth electrode film 216 and a higher etch rate for the hard mask film 218.

Figure 5A:
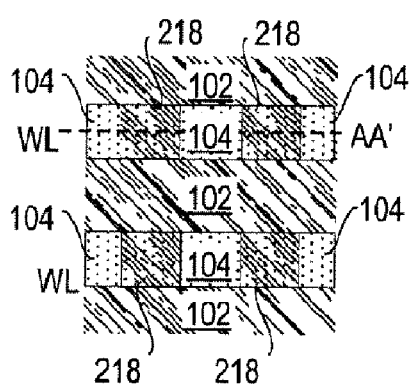
Figure 5B:
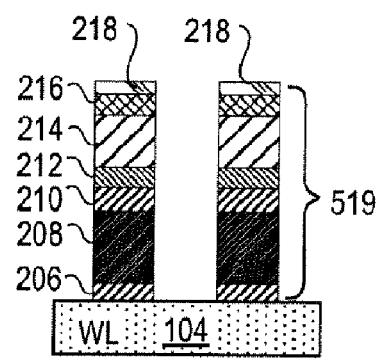

FIG. 5A is another plan view and FIG. 5B is another elevation view cross-section schematic of PCM memory device 150 during fabrication. FIGS. 5A-5B depict PCM memory device 150 after selectively removing material from the deposited stack of films. FIG. 5B depicts a cross-section of FIG. 5A along line AK as indicated.

As shown in FIG. 5A, PCM memory device 150 comprises one or more wordline structures 104, first electrode film 206, phase change material (PCM) film 208, second electrode film 210, third electrode film 212, access device film 214, fourth electrode film 216, and hard mask film 218, coupled as shown. In an embodiment, stack of films 206, 208, 210, 212, 214, 216 is patterned as described herein to selectively remove material of the stack of films 206, 208, 210, 212, 214, 216.

Material of stack of films 206, 208, 210, 212, 214, 216 may be selectively removed to form one or more pillar structures 519 comprising the stack of films 206, 208, 210, 212, 214, 216. The one or more pillar structures 519 may be coupled with the one or more wordline structures 104. The first electrode film 206, the PCM film 208, and the second electrode film 210 may form one or more PCM memory cells. The third electrode film 212, the access device film 214, and the fourth electrode film 216 may form one or more access devices. PCM memory device 150 may comprise one or more PCM memory cells 206, 208, 210 formed on the one or more wordline structures 104 and one or more access devices 212, 214, 216 formed on the one or more PCM memory cells.

Material of stack of films 206, 208, 210, 212, 214, 216 may be selectively removed by etching. In an embodiment, etching the stack of films 206, 208, 210, 212, 214, 216 substantially removes material of the stack of films 206, 208, 210, 212, 214, 216 in regions that are not protected by the patterned hard mask film 218. In an embodiment, an anisotropic etch process is used. In an embodiment, a single mask etch is used to remove material of the stack of films 206, 208, 210, 212, 214, 216. Etching may stop at the one or more wordline structures 104. In an embodiment, wordline structure 104 comprises a material that has a sufficiently different etch selectivity than materials of the stack of films 206, 208, 210, 212, 214, 216 to provide an etch stop.

Material of the stack of films 206, 208, 210, 212, 214, 216 may be removed in areas that do not underlie the patterned hard mask film 218. Such material of the stack of films 206, 208, 210, 212, 214, 216 may be substantially removed to expose the wordline 104 and semiconductor substrate 102. In an embodiment, one or more PCM memory cells comprising films 206, 208, 210 may comprise a substantially rectangular shape to increase process margin of the one or more PCM memory cells. In an embodiment, stack of films 206, 208, 210, 212, 214, 216 comprise a substantially rectangular shape as a result of the rectangular hard mask film 218 formed using the first and second one dimensional patterns. Substantially rectangular may be broadly construed. Corners may be rounded, for example, by processes such as etch processes.

Figure 6A:
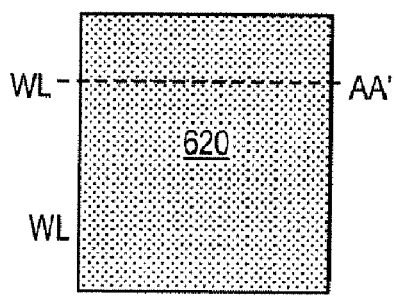
Figure 6B:
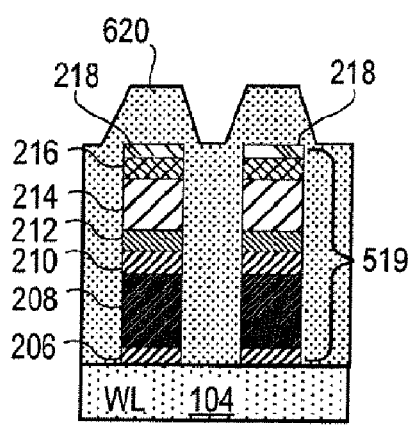

FIG. 6A is another plan view and FIG. 6B is another elevation view cross-section schematic of PCM memory device 150 during fabrication. FIGS. 6A-6B depict PCM memory device 150 after depositing dielectric material 620. FIG. 6B depicts a cross-section of FIG. 6A along line AA' as indicated.

As shown in FIG. 6A, PCM memory device 150 comprises one or more wordline structures 104, first electrode film 206, phase change material (PCM) film 208, second electrode film 210, third electrode film 212, access device film 214, fourth electrode film 216, hard mask film 218, and first dielectric material 620, coupled as shown. During fabrication, PCM memory device 150 may undergo a cleaning process prior to deposition of first dielectric material 620.

A first dielectric material 620 may be deposited to substantially fill an area external to the one or more pillar structures 519. In an embodiment, first dielectric material 620 is conformally deposited. First dielectric material 620 may be coupled with the one or more pillar structures 519 and with the one or more wordline structures 104. In an embodiment, first dielectric material 620 is coupled with the semiconductor substrate 102 to substantially fill an area between the one or more pillars 519, the one or more pillars 519 comprising one or more PCM memory cells comprising films 206, 208, 210 and one or more access devices comprising films 212, 214, 216.

First dielectric material 620 may comprise a variety of materials. In an embodiment, first dielectric material 620 comprises, for example, an oxide material such as, for example, silicon oxide ($SiO_2$), or high density plasma (HDP) oxide, or atomic layer deposition (ALD) oxide, or combinations thereof. Subject matter is not limited in this regard and may include other materials in other embodiments.

Figure 7A:
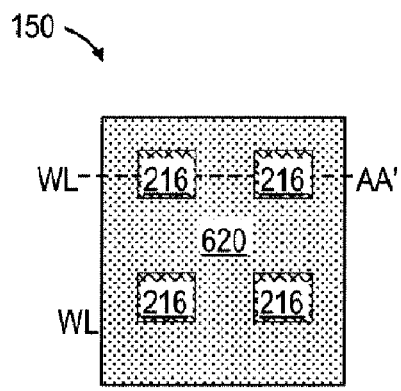
Figure 7B:
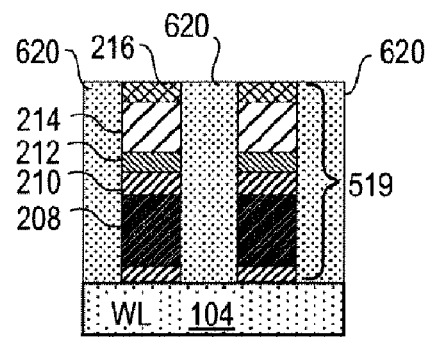

FIG. 7A is another plan view and FIG. 7B is another elevation view cross-section schematic of PCM memory device 150 during fabrication. FIGS. 7A-7B depict PCM memory device 150 after removing hard mask film 218 and smoothing first dielectric material 620. FIG. 7B depicts a cross-section of FIG. 7A along line AA' as indicated.

First dielectric material 620 and hard mask film 218 may be etched, or polished, or combinations thereof, to form a surface of the first dielectric material 620 that is substantially planar with a surface of the fourth electrode film 216. In an embodiment, polishing is accomplished by chemical mechanical planarization (CMP). Forming a substantially smooth or planar surface of the first dielectric material 620 and/or removing the hard mask film 218 may be accomplished by other techniques in other embodiments.

Figure 8A:
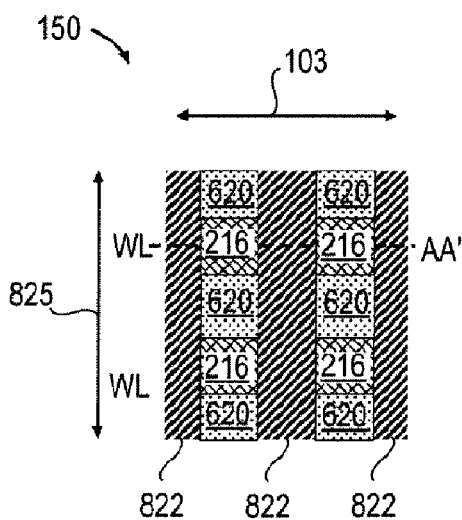
Figure 8B:
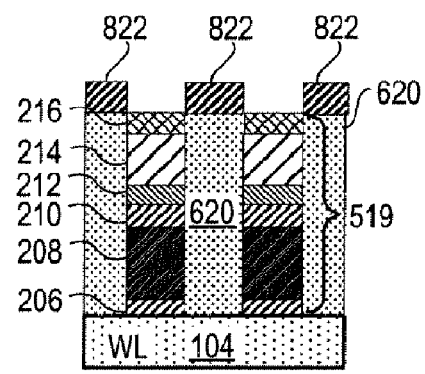

FIG. 8A is another plan view and FIG. 8B is another elevation view cross-section schematic of PCM memory device 150 during fabrication. FIGS. 8A-8B depict PCM memory device 150 after depositing and patterning a second dielectric material 822. FIG. 8B depicts a cross-section of FIG. 8A along line AA' as indicated.

One or more bitline structures 924 may be formed on the smoothed first dielectric material 620. In an embodiment, the one or more bitline structures 924 are formed by a damascene process. A second dielectric material 822 may be deposited on the first dielectric material 620 and to fourth electrode film 216. Second dielectric material 822 may be patterned using, for example, lithography and/or etch processes to form one or more line structures comprising the second dielectric material 822 and one or more trench structures wherein the fourth electrode film 216 and the first dielectric material 620 are exposed in the trench structures. The one or more line structures comprising second dielectric material 822, or the one or more trench structures comprising exposed fourth electrode film 216 and second dielectric material 822, or combinations thereof, may have a longitudinal direction 825 that is substantially perpendicular with the longitudinal direction 103 of the one or more wordline structures 104. The trench structures may comprise an area to be filled with bitline material to form one or more bitline structures 924 according to FIG. 9.

In another embodiment, the one or more bitline structures 924 are formed by other processes including, for example, depositing a bitline material on the first dielectric material 620, and patterning using, for example, lithography and/or etch, to provide one or more bitline structures 924 coupled as shown in FIG. 9. Second dielectric material 822 may be deposited after the one or more bitline structures 924 are formed.

Second dielectric material 822 may comprise a variety of materials. In an embodiment, second dielectric material 822 comprises, for example, an oxide material such as, for example, silicon oxide ($SiO_2$), or high density plasma (HDP) oxide, or combinations thereof. Subject matter is not limited in this regard and may include other materials in other embodiments.

Figure 9A:
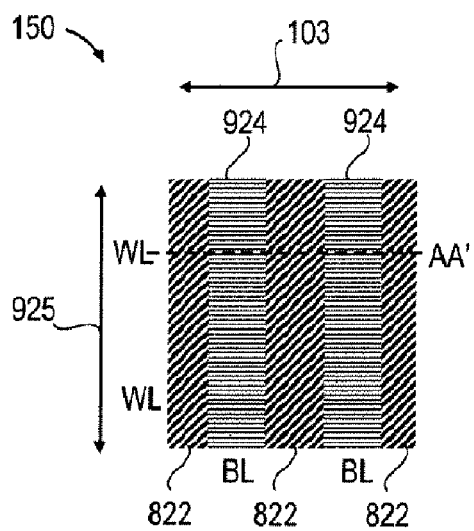
Figure 9B:
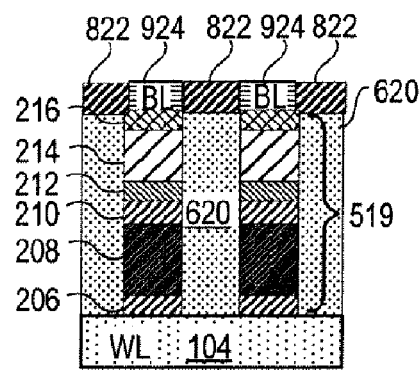

FIG. 9A is another plan view and FIG. 9B is another elevation view cross-section schematic of PCM memory device 150 during fabrication. FIGS. 9A-9B depict PCM memory device 150 after depositing and polishing a bitline material 924. FIG. 9B depicts a cross-section of FIG. 9A along line AA' as indicated.

In an embodiment, one or more bitline structures 924 are formed. One or more bitline structures 924 may be coupled with the first dielectric material 620 and coupled with the fourth electrode film. In an embodiment, the one or more bitline structures 924 have a longitudinal direction 925 that is substantially perpendicular with the longitudinal direction 103 of the one or more wordline structures 104. One or more bitline structures 924 may be formed by depositing a bitline material 924 on the one or more trenches formed in the second dielectric material 822. The bitline material 924 and the second dielectric material 822 may be polished to form a substantially smooth or planar surface. In an embodiment, CMP is used to provide a smooth or planar surface.

In an embodiment, the one or more bitline structures 924 are coupled with the one or more access devices comprising films 212, 214, 216 and the dielectric material 620, 822. One or more bitline structures 924 may be coupled with fourth electrode film 216. The one or more bitline structures 924 may comprise a metal. In an embodiment, one or more bitline structures 924 comprise aluminum (Al), copper (Cu), or tungsten (W), or combinations thereof. Subject matter is not limited in this regard and may include other materials in other embodiments.

A product fabricated by methods described herein is also disclosed. The product may comprise a PCM memory device (e.g., PCM memory device 150). In an embodiment, PCM memory device 150 comprises a semiconductor substrate 102, one or more wordline structures 104 coupled with the semiconductor substrate 102, one or more phase change material (PCM) memory cells comprising films 206, 208, 210 coupled with the one or more wordline structures, and one or more access devices comprising films 212, 214, and 216 coupled with the one or more PCM memory cells.

Figure 10:
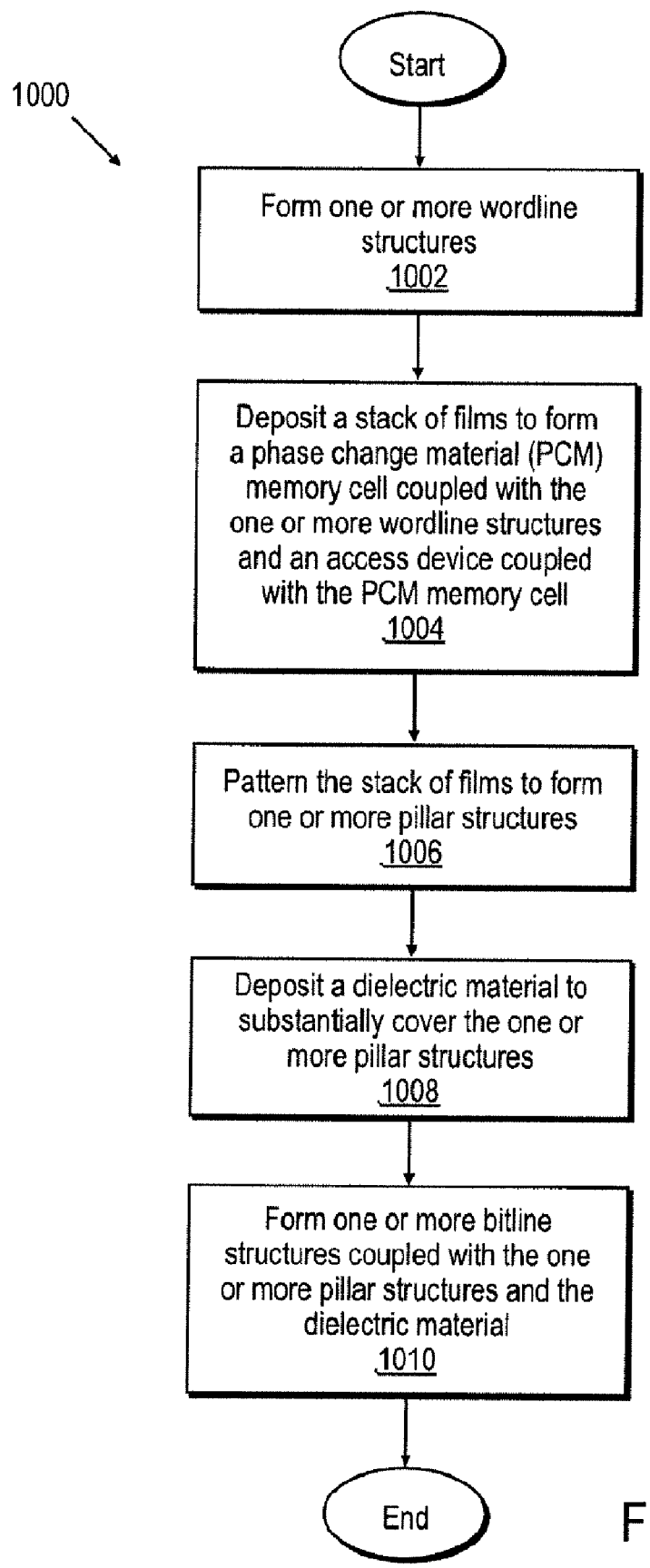
FIG. 10 is a process flow diagram of a method for fabricating a PCM memory device, in accordance with various embodiments of the present invention.

FIG. 10 is a process flow diagram of a method for fabricating a PCM memory device, in accordance with various embodiments of the present invention. In an embodiment, method 1000 includes forming one or more wordline structures at 1002, depositing a stack of films to form a phase change material (PCM) memory cell coupled with the one or more wordlines structures and an access device coupled with the PCM memory cell at 1004, patterning the stack of films to form one or more pillar structures at 1006, depositing a dielectric material to substantially cover the one or more pillar structures at 1008, and forming one or more bitline structures coupled with the one or more pillar structures and the dielectric material at 1010.

Method 1000 may comprise forming one or more wordline structures at 1002. Forming one or more wordline structures at 1002 may be accomplished in a variety of ways. In an embodiment, forming one or more wordline structures at 1002 comprises depositing a wordline material on a semiconductor substrate, patterning to define the one or more wordline structures, and etching to form the one or more wordline structures. In another embodiment, forming the one or more wordline structures at 1002 comprises using a damascene process. The one or more wordline structures may comprise a metal.

Method 1000 may further comprise depositing a stack of films to form a phase change material (PCM) memory cell coupled with the one or more wordlines structures and an access device coupled with the PCM memory cell at 1004. Depositing a stack of films at 1004 may include depositing a first electrode film on one or more wordline structures, depositing a phase change material (PCM) film on the first electrode film, depositing a second electrode film on the PCM film, depositing a third electrode film on the second electrode film, depositing an access device film on the third electrode film, and depositing a fourth electrode film on the access device film to form a stack of films comprising the first electrode film, the PCM film, the second electrode film, the third electrode film, the access device film, and the fourth electrode film. In an embodiment, deposition of such films is accomplished by physical vapor deposition (PVD), chemical vapor deposition (CVD), atomic layer deposition (ALD), or combinations thereof. Subject matter is not limited in this regard and may include other deposition techniques in other embodiments.

Depositing the first, second, third, and fourth electrode films may comprise depositing a metal having a thickness less than approximately 30 nanometers (nm). Depositing the PCM film may comprise depositing a phase change material having at thickness less than approximately 60 nm. Depositing the access device film may comprise depositing polysilicon, or a material comprising germanium (Ge), antimony (Sb), or tellurium (Te), or combinations thereof, having a thickness less than approximately 60 nm.

In an embodiment, no patterning processes are performed on the stack of films until after depositing a fourth electrode film on the access device film. Patterning processes may include, for example, lithography and/or etch processes to define and/or remove material from the stack of films. Such technique may allow for a self-aligned integration to simultaneously pattern an access device coupled with a PCM memory cell.

Method 1000 may further comprise patterning the stack of films to form one or more pillar structures at 1006. In an embodiment, method 1000 comprises patterning the stack of films to form one or more pillar structures at 1006, the one or more pillar structures being coupled with the one or more word line structures. The one or more pillar structures may comprise the stack of films wherein the first electrode film, the PCM film, and the second electrode film form one or more PCM memory cells, and wherein the third electrode film, the access device film, and the fourth electrode film form one or more access devices.

In an embodiment, patterning the stack of films to form one or more pillar structures at 1006 comprises depositing a hard mask film on the stack of films, patterning the hard mask film using a first one dimensional pattern comprising lines and spaces wherein a longitudinal direction of the lines of the first one dimensional pattern is substantially parallel with or substantially perpendicular with a longitudinal direction of the one or more wordline structures, and etching the hard mask film to remove material from the spaces of the first one dimensional pattern.

Patterning the stack of films to form one or more pillar structures at 1006 may further comprise patterning the hard mask film using a second one dimensional pattern to form lines and spaces wherein a longitudinal direction of the lines of the second one dimensional pattern is substantially perpendicular with the longitudinal direction of the lines of the first one dimensional pattern and etching the hard mask film to remove material from the spaces of the second one dimensional pattern.

Patterning the stack of films to form one or more pillar structures at 1006 may further comprise etching the stack of films to substantially remove material of the stack of films in regions that are not protected by the patterned hard mask film. The etching to remove material of the stack of films may comprise a single masking operation. In an embodiment, the etching is anisotropic and the etching stops at the one or more wordlines structures or the semiconductor substrate, or combinations thereof.

Method 1000 may further include depositing a dielectric material to substantially cover the one or more pillar structures at 1008. In an embodiment, method 1000 includes depositing a first dielectric material to substantially fill an area external to the one or more pillar structures wherein the first dielectric material is coupled with the one or more pillar structures and with the one or more wordline structures. Method 1000 may further include removing a portion of the first dielectric material and substantially all of the hard mask film by etch, or by polish, or combinations thereof, such that a surface of the first dielectric material is substantially planar with a surface of the fourth electrode film.

Method 1000 may further include forming one or more bitline structures coupled with the one or more pillar structures and the dielectric material at 1010. In an embodiment, method 1000 comprises forming one or more bitline structures coupled with the first dielectric material and coupled with the fourth electrode film at 1010 wherein the one or more bitline structures have a longitudinal direction that is substantially perpendicular with the longitudinal direction of the one or more wordline structures.

Forming the one or more bitline structures at 1010 may be accomplished in a variety of ways. In an embodiment, a bitline material is deposited on the first dielectric material and the fourth electrode film and subsequently patterned to form one or more bitline structures. In another embodiment, a damascene process is used to form one or more bitline structures.

In an embodiment, forming one or more bitline structures at 1010 comprises depositing a second dielectric material on the first dielectric material and the fourth electrode film, patterning the second dielectric material to form one or more trenches wherein the one or more trenches have a longitudinal direction that is substantially perpendicular with the longitudinal direction of the wordline, and depositing a bitline material into the one or more trenches formed in the second dielectric material. Forming the one or more bitline structures at 1010 may further comprise polishing the bitline material and the second dielectric material to form a substantially smooth or planar surface.

Various operations may have been described as multiple discrete operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

Although certain embodiments have been illustrated and described herein for purposes of description of the preferred embodiment, it will be appreciated by those of ordinary skill in the art that a wide variety of alternate and/or equivalent embodiments or implementations calculated to achieve the same purposes may be substituted for the embodiments illustrated and described without departing from the scope of the present invention. Those with skill in the art will readily appreciate that embodiments in accordance with the present invention may be implemented in a very wide variety of ways. This application is intended to cover any adaptations or variations of the embodiments discussed herein. Therefore, it is manifestly intended that embodiments in accordance with the present invention be limited only by the claims and the equivalents thereof.

What is claimed is:

1. A method, comprising:
   depositing a first electrode film on one or more wordline structures;
   depositing a phase change material (PCM) film on the first electrode film;
   depositing a second electrode film on the PCM film;
   depositing a third electrode film on the second electrode film;
   depositing an access device film on the third electrode film; and
   depositing a fourth electrode film on the access device film to form a stack of films, wherein the stack of films comprises the first electrode film, the PCM film, the second electrode film, the third electrode film, the access device film, and the fourth electrode film, and wherein no patterning processes are performed on the stack of films until after deposition of the fourth electrode film on the access device film.

2. The method of claim 1, wherein:
   depositing each of the first electrode film, the second electrode film, the third electrode film, and the fourth electrode film comprises depositing a metal having a thickness less than approximately 30 nanometers (nm);
   depositing the PCM film comprises depositing a phase change material having a thickness less than approximately 60 nm;
   depositing the access device film comprises depositing polysilicon, or a material comprising germanium (Ge), antimony (Sb), or tellurium (Te), or combinations thereof, the access device film having a thickness less than approximately 60 nm; and
   the one or more wordline structures comprise a metal.

3. The method of claim 1, further comprising forming the one or more wordline structures, wherein forming the one or more wordline structures comprises:
   depositing a wordline material on a semiconductor substrate;
   patterning the wordline material to define the one or more wordline structures; and
   etching the wordline material to form the one or more wordline structures.

4. The method of claim 1, further comprising forming the one or more wordline structures using a damascene process.

5. The method of claim 1, further comprising:
   patterning the stack of films to form one or more pillar structures comprising the stack of films, the one or more pillar structures being coupled with the one or more wordline structures;
   wherein the first electrode film, the PCM film, and the second electrode film form one or more PCM memory cells; and
   wherein the third electrode film, the access device film, and the fourth electrode film form one or more access devices.

6. The method of claim 5, wherein patterning the stack of films to form one or more pillar structures comprises:
   depositing a hard mask film on the stack of films;
   patterning the hard mask film using a first one dimensional pattern comprising i) lines and ii) spaces, wherein a longitudinal direction of the lines of the first one dimensional pattern is substantially parallel with or substantially perpendicular with a longitudinal direction of the one or more wordline structures;
   etching the hard mask film to remove material from the spaces of the first one dimensional pattern;
   patterning the hard mask film using a second one dimensional pattern comprising i) lines and ii) spaces, wherein a longitudinal direction of the lines of the second one dimensional pattern is substantially perpendicular with the longitudinal direction of the lines of the first one dimensional pattern; and
   etching the hard mask film to remove material from the spaces of the second one dimensional pattern.

7. The method of claim 6, wherein patterning the stack of films to form one or more pillar structures further comprises:
   etching the stack of films to substantially remove material of the stack of films in regions that are not protected by the patterned hard mask film.

8. The method of claim 7, wherein the etching is anisotropic, and wherein the etching stops at the one or more wordline structures.

9. The method of claim 7, further comprising:
   depositing a first dielectric material to substantially fill an area external to the one or more pillar structures, wherein the first dielectric material is coupled with the one or more pillar structures and with the one or more wordline structures; and
   removing a portion of the first dielectric material and substantially all of the hard mask film by etch, or by polish, or combinations thereof, such that a surface of the first dielectric material is substantially planar with a surface of the fourth electrode film.

10. The method of claim 9, further comprising:
forming one or more bitline structures coupled with the first dielectric material and coupled with the fourth electrode film, wherein the one or more bitline structures have a longitudinal direction that is substantially perpendicular with the longitudinal direction of the one or more wordline structures.

11. The method of claim 10, wherein forming the one or more bitline structures comprises:
depositing a second dielectric material on i) the first dielectric material and ii) the fourth electrode film;
patterning the second dielectric material to form one or more trenches wherein the one or more trenches have a longitudinal direction that is substantially perpendicular with the longitudinal direction of the wordline; and
depositing a bitline material into the one or more trenches formed in the second dielectric material.

12. The method of claim 11, further comprising:
polishing the bitline material and the second dielectric material to form a substantially smooth surface.

* * * * *